United States Patent [19]

Pisarski

[11] Patent Number: 5,326,051
[45] Date of Patent: Jul. 5, 1994

[54] ELECTRO-EXPULSIVE DEICING SYSTEM HAVING CIRCUIT BOARD EXPULSIVE MEMBERS

[75] Inventor: Nathan Pisarski, Stow, Ohio

[73] Assignee: The B. F. Goodrich Company, Akron, Ohio

[21] Appl. No.: 906,714

[22] Filed: Jun. 30, 1992

[51] Int. Cl.⁵ ............................................. B64D 15/16
[52] U.S. Cl. ................................. 244/134 D; 156/901
[58] Field of Search .......... 244/134 D, 134 R, 134 A; 156/629, 634, 901, 902

[56] References Cited

U.S. PATENT DOCUMENTS

| | | | |
|---|---|---|---|
| 3,809,341 | 5/1974 | Levin et al. | 244/134 R |
| 4,545,553 | 10/1985 | Finke et al. | 244/134 D |
| 4,690,353 | 9/1987 | Haslim et al. | 244/134 D |
| 4,875,644 | 10/1989 | Adams et al. | 244/134 R |
| 4,894,569 | 1/1990 | Lardiere, Jr. et al. | 244/134 D |
| 4,982,121 | 1/1991 | Lardiere, Jr. et al. | 244/134 R |
| 5,129,598 | 7/1992 | Adams et al. | 244/134 D |
| 5,142,767 | 9/1992 | Adams et al. | 29/602.1 |
| 5,143,325 | 9/1992 | Zieve et al. | 244/134 D |
| 5,152,480 | 10/1992 | Adams et al. | 244/134 D |

FOREIGN PATENT DOCUMENTS

| | | | |
|---|---|---|---|
| 1230668 | 9/1960 | France | 244/134 R |
| 2121745 | 1/1984 | United Kingdom | 244/134 D |
| 2252285 | 8/1992 | United Kingdom | 244/134 D |

*Primary Examiner*—Michael S. Huppert
*Assistant Examiner*—Anne E. Bidwell
*Attorney, Agent, or Firm*—Richard A. Romanchik

[57] ABSTRACT

An electroexpulsive deicing system 18 in accordance with the present invention includes a plurality of expulsive elements 18, 22 comprised of printed circuit boards 12 having a plurality of parallel metal lines 14 formed thereon in a predetermined pattern. Adjacent expulsive elements have current flowing in opposite directions for creating expulsive electromagnetic forces between elements.

29 Claims, 3 Drawing Sheets

ELECTRO-EXPULSIVE DEICING SYSTEM HAVING CIRCUIT BOARD EXPULSIVE MEMBERS

TECHNICAL FIELD

This invention relates to a system for separating a solid body, such as a layer of ice, from the surface of a resilient member, and more particularly to an electrically activated deicing system for use on leading edges of aircraft.

BACKGROUND OF THE INVENTION

Under certain operating conditions aircraft are vulnerable to the accumulation of ice on component surfaces. It is well known that such accumulation of ice can lead to disastrous results. A wide variety of systems have been developed for removing ice from aircraft during flight and can be placed into three general categories: thermal, chemical and mechanical.

The mechanical category of deicing systems operate by distorting the airfoil surface of the aircraft to be deiced. Distortion of the airfoil surface causes cracking in the ice accumulated thereon and subsequent dispersal of that ice into the air stream passing over the aircraft component.

U.S. Pat. No. 4,690,353 to Haslim et al. and commonly owned U.S. Pat. No. 4,875,644 to Adams et al. describe a subcategory of mechanical deicing systems wherein one or more overlapped flexible ribbon conductors are embedded in an elastomeric material affixed to the outer surface of an airfoil structure. The conductors are fed large current pulses from a power storage unit. The conductors are configured such that overlapping conductors carry opposing currents. The resulting interacting magnetic fields of these overlapping conductors produces an electro-expulsive force which distends the elastomeric member and separates the elastomeric member from a solid body, such as ice accumulated thereon. The preferred method in Haslim et al. to provide overlapping conductors having opposing currents traveling therethrough is to form the conductor in a serpentine like configuration. Adams et al. discloses an improvement upon the disclosure of Haslim et al., wherein rather than having a serpentine type configuration, Adams et al. contemplates having electrically conductive members interconnected such that electrical current flows in the same direction in adjacent electrically conductive members in a first sheet-like array and also flows in adjacent electrically conductive members of a second sheet-like array in a direction opposite to the current flowing in the first sheet-like array. The first and second sheet like arrays are therefore coextensive and superposed proximate to each other such that the electrically conductive members of the first and second sheet like arrays are substantially parallel. It was found in Adams et al. that the configuration of the conductive members into sheet like arrays provided a much greater expulsive force than that provided by the serpentine type conductive configuration of the Haslim et al. disclosure.

It has been discovered however, that it is both difficult and expensive to manufacture conductors in the arrangements disclosed in Haslim et al. and Adams et al. The continuous conductive members in both of these patents must be formed or machined from a solid piece of conductor, or ribbon cable into a twisting, turning, folding shape. Forming these types of conductive members is labor intensive and therefore quite expensive to manufacture. Another disadvantage to the conductive members disclosed in Haslim et al. and Adams et al. is the weak point created when the conductive members are folded. Extensive use of the conductive members described therein causes fatigue and eventual breaking of the conductive member at the fold.

An electro-expulsive separation deicing system which overcomes the above identified disadvantages of prior electro-expulsive deicing systems is, therefore, highly desirable.

DISCLOSURE OF THE INVENTION

According to one aspect of the present invention, an electro-expulsive deicing system includes a pair of circuit boards, each circuit board having a plurality of parallel spaced apart conductors formed thereon in a serpentine configuration and electrically interconnected so that current flowing in the conductors on each board flows in the same direction. The circuit boards are superposed proximate to one another so that the conductors of the boards line up with one another. The two circuit boards are electrically interconnected so that current flowing in the conductors of the first circuit board flows in a direction opposite to the current flowing in the conductors of the other circuit board.

According to another aspect of the present invention, an electro-expulsive deicing system includes a pair of first and second circuit board assemblies, with multiple circuit boards provided in each assembly. Each circuit board has a plurality of parallel spaced apart conductors formed thereon in a serpentine configuration. The circuit boards of each circuit board assembly are superposed proximate to one another so that the conductors line up with one another. The circuit board assemblies are electrically interconnected so that: a) current flowing in the conductors of all circuit boards of the first circuit board assembly flows in the same direction; b) current flowing in the conductors of all circuit boards of the second circuit board assembly flows in the same direction; and c) current flowing in the conductors of the first circuit board assembly flows in a direction opposite to the current flowing in the conductors of the second circuit board assembly.

The present invention provides electro-expulsive forces for dislodging ice on aircraft surfaces. It is inexpensive to manufacture because it utilizes well established circuit board manufacturing techniques which are cost-effective and very reliable.

These and other objects, features and advantages of the present invention will become more apparent in light of the detailed description of exemplary embodiments thereof, as illustrated by the drawings.

BEST MODE FOR CARRYING OUT THE INVENTION

Figure 1A:
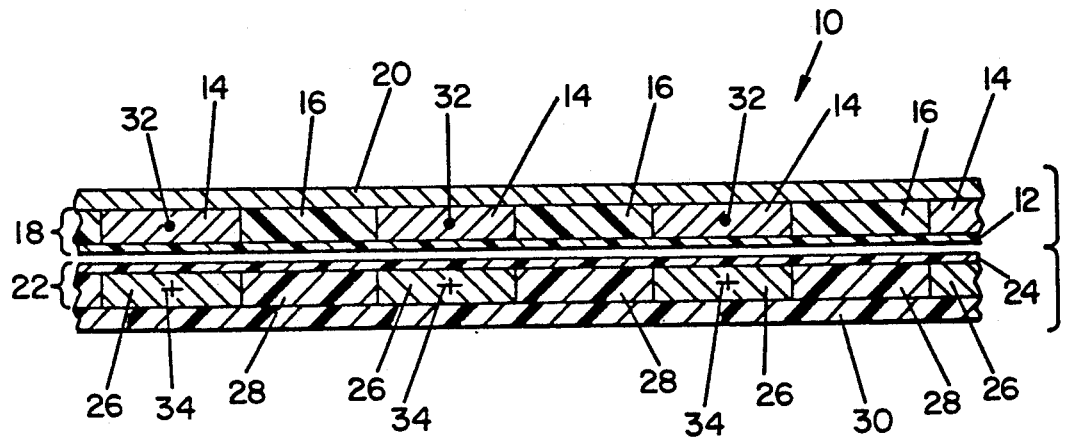
FIG. 1A is a cross-sectional view taken along line 1—1 of FIG. 3A of a first embodiment of an electro-expulsive deicing system in accordance with the present invention.

Referring now to FIG. 1A, a first embodiment of an electro-expulsive deicing system 10 in accordance with the present invention includes a circuit board 18 comprised of a circuit board substrate 12 having a pattern of substantially parallel, electrically isolated conductive lines 14 formed thereon. The preferred pattern for conductive lines 14 is a serpentine or zig-zag type configuration illustrated and described in greater detail hereinafter for FIG. 3A. Circuit board substrate 12 is preferably a circuit board substrate composed of any of a number of materials (dielectric or insulation) well known in the printed circuit board art for forming conductive patterns thereon. For instance, circuit board substrate 12 may be composed of either fiberglass, polyamide, epoxy film, or other plastics utilized in the semiconductor printed circuit board manufacturing arts. Conductive lines 14 may be comprised of any of a number of a conductive materials, such as copper, which can be formed utilizing well known practices for forming conductive lines on printed circuit boards, such as etching or deposition techniques. An acceptable etching technique is to provide a circuit board comprised of a sheet of metal disposed on and bonded to a circuit board substrate. The pattern for the conductive lines is masked onto the metal sheet utilizing an etch resistant material. The metal sheet is etched off, thereby leaving the pattern remaining on the circuit board substrate and then the etch resistant material is removed off the pattern. An acceptable deposition technique is to provide a circuit board substrate, mask the negative image of the pattern for the conductive lines onto the circuit board substrate utilizing a deposition resistant material, deposit the metal onto the substrate thereby leaving the metal on the substrate in the desired pattern, and then remove the deposition resistant material. Conductive lines 14 should be parallel or substantially parallel to minimize counter productive electro-magnetic force interaction between the lines. Although four lines are shown for exemplary purposes in FIG. 1, it is to be understood that other quantities of lines may be utilized to achieve a similar purpose. The conductive lines 14 are preferably arranged in a serpentine configuration. Other patterns however, not specifically described herein, may also be utilized to achieve a similar electro-expulsive purpose.

Conductive lines 14 are illustrated as being substantially thicker than circuit board substrate 12 for exemplary purposes only. The preferred thickness of circuit board substrate 12 is about 0.005 inches and the preferred thickness of conductive lines 14 is about 0.005 to 0.020 inches. Depending on the specific configuration utilized, it may be necessary to provide electrical insulation or isolation members 16 between the conductive lines 14 in order to prevent arcing between conductive lines 14.

First circuit board 18 is disposed directly beneath or adjacent to a surface ply or layer 20. Surface ply 20 represents the aircraft airfoil surface to be deformed. It is preferable that circuit board 18 be bonded to surface ply 20 utilizing any of a number of bonding agents well known to those skilled in the art, such as an epoxy film adhesive. Surface ply 20 may be composed of any of a number of materials well known in the deicing art, such as rubber and polyurethanes or plastics such as polyetheretherketone (PEEK) or a thin metal layer such as titanium or stainless steel foil. If an electrical conductor is used, however, an additional electrical insulation or isolation layer (not shown) must be utilized between the circuit board 18 and the surface ply 20 in order to insulate conductive lines 14. A second-circuit board layer 22 (substantially similar to circuit board layer 18) is disposed directly beneath the circuit board layer 18, and is comprised of a substrate 24 having a plurality of substantially parallel, electrically isolated conductive lines 26 formed thereon. Electrical insulation or isolation members 28 may be formed between the conductive lines 26. Substrate 24, conductive lines 26 and insulative members 28 are comprised of correspondingly similar materials to the elements of circuit board 18. A bottom ply or layer 30 is disposed below circuit board 22 for providing structural integrity. It is preferable that circuit board 22 be bonded to bottom ply 30 utilizing any of a number of bonding agents well known to those skilled in the art, such as an epoxy film adhesive.

The conductive lines 14, 26 of circuit boards 18 and 22 are interconnected so that: a) all current flowing in the conductive lines of each board (e.g. lines 14) flows in the same direction; and b) current flowing in the conductive lines 14 flows in the opposite direction to the current flowing in conductive lines 26. The interconnection means will be shown and described in greater detail hereinafter. For exemplary purposes, dots 32 signify that current is flowing into the plane of the drawing and crosses 34 signify that current is flowing out of the plane of the drawing. In this manner it is illustrated that current flowing in conductors 14 flows in an opposite direction than current flowing in conductors 26.

The first circuit board 18 is a moving layer so that when current is sent through conductive lines 14 and 26, moving circuit board layer 18 creates the physical disturbance in the aircraft airfoil 20. The second circuit board 22 is therefore a stationary layer and must be secured to some structural member within the aircraft airframe. Consequently, bottom ply 30 must be comprised of a material, such as fiberglass prepreg, kevlar prepreg, PEEK or a metal such as titanium or stainless steel, which is strong enough to facilitate securing circuit board layer 22. If an electrical conductor is used, however, an additional electrical insulation or isolation layer (not shown) must be utilized between the circuit board layer 22 and the bottom ply 30 in order to insulate conductive lines 26.

Figure 1B:
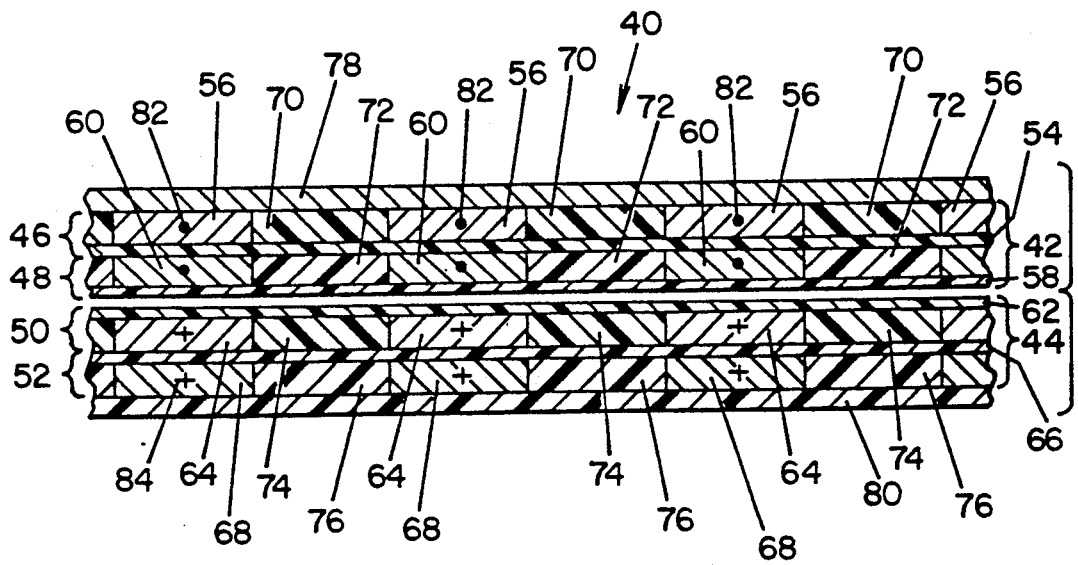
FIG. 1B is a cross-sectional view taken along line 1—1 of FIG. 3A of a second embodiment of an electro-expulsive deicing system in accordance with the present invention.

Referring now to FIG. 1B, a second embodiment 40 of an electro-expulsive deicing system in accordance with the present invention includes two expulsive layers 42, 44 comprised of four circuit board layers 46, 48, 50, 52. Each circuit board layer 46–52 is comprised of circuit boards substantially similar to circuit boards 18, 22 of FIG. 1A. A top circuit board 46 is comprised of a substrate 54 having a plurality of substantially parallel conductive lines 56 formed thereon. A second circuit board 48 is comprised of a substrate 58 having a plurality of substantially parallel conductive lines 60 formed thereon. A third circuit board 50 is comprised of a substrate 62 having a plurality of substantially parallel conductive lines 64 formed thereon. A fourth circuit board 52 is comprised of a substrate 66 having a plurality of substantially parallel conductive lines 68 formed thereon. Circuit boards 46, 48 and 50, 52 are bonded together respectively in a manner substantially similar to circuit boards 18, 22 of FIG. 1A. Electrical insulation or isolation members 70, 72, 74, 76 prevent arcing between conductive lines 46, 48, 50, 52, respectively, and are substantially similar to insulative members 16, 28 of FIG. 1A.

Circuit board 46 is disposed and bonded adjacent to and below a surface ply or layer 78, which is substantially similar to surface ply 20 of FIG. 1A. Circuit board 52 is disposed and bonded adjacent to and above a bottom ply or layer 80 substantially similar to surface ply 30 of FIG. 1A.

Circuit boards 46–52 are electrically interconnected so that: a) current flows in the same direction in the conductive lines of each circuit board; b) the current flow in circuit boards 46 and 48 is in the same direction; c) the current flow in circuit boards 50 and 52 is in the same direction; and d) the current flow in circuit boards 46, 48 is in an opposite direction to the current flow in circuit boards 50 and 52. For exemplary purposes, dots 82 illustrate that current is flowing into the plane of the drawing through conductive lines 46, 48 and crosses 84 illustrate that current flows out of the plane of the drawing through conductive lines 50, 52.

When a large impulse current flows through the conductors in the manner illustrated, expulsive layer 42 is expulsed away from expulsive layer 44. Expulsive layer 42 is a moving layer and expulsive layer 44 is a stationary layer.

Figure 2A:
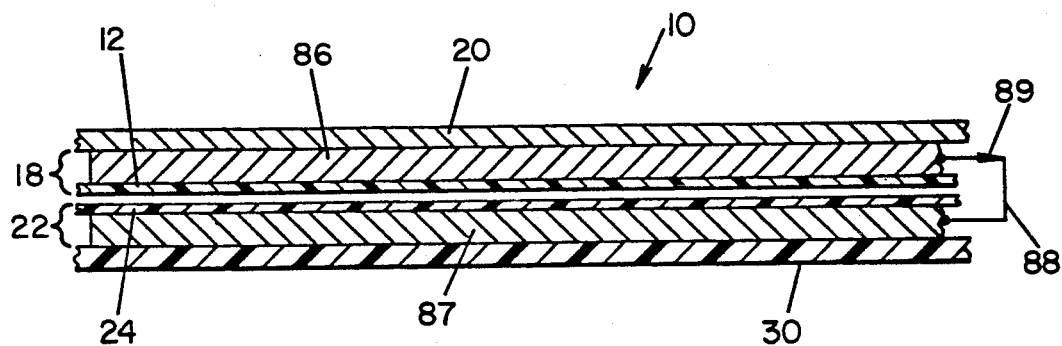
FIG. 2A is a cross-sectional view taken along line 2—2 of FIG. 3A of a first embodiment of an electro-expulsive deicing system in accordance with the present invention.

Referring now to FIG. 2A, an electro-expulsive deicing system 10 in accordance with the present invention includes a top circuit board 18 comprised of conductive lines (illustrated in FIG. 1A) formed on a circuit board substrate 12. A bottom circuit board 22 is comprised of conductive lines (illustrated in FIG. 1A) formed on a circuit board substrate 24. Conductive lines 14 are electrically interconnected on circuit board 18 with an electrical bus 86 formed on substrate 12 in a manner similar to the formation of conductive lines 14. Electrical bus 86 is located at the end of the conductive lines 14. Conductive lines 26 are electrically interconnected on circuit board 22 with an electrical bus 87 formed on substrate 24 in a manner similar to the formation of conductive lines 26. Electrical bus 87 is located at the end of the conductive lines 26. Electrical buses 86, 87 are connected serially by an electrically conductive path 88 so that current flows in opposite directions in conductive lines 14 and 26. Arrows 89 illustrate the direction of flow of the current. Electrically conductive path 88 may be any of a number of means adapted to provide electrical conduction between conductive lines 14 and 26, such as a flexible bus or ribbon cable. The conductive path 88 must however, be flexible enough to facilitate separation of the two circuit boards 18, 22 when current flows through them.

Figure 2B:
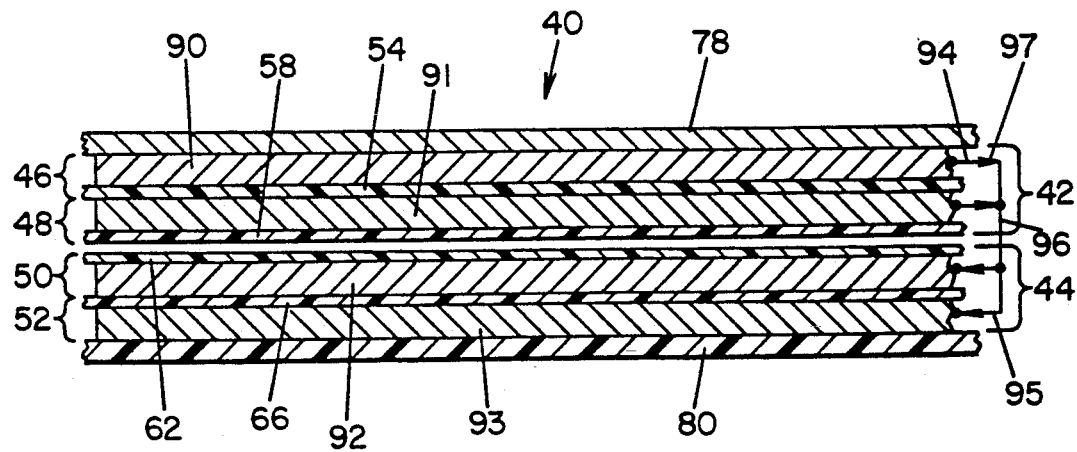
FIG. 2B is a cross-sectional view, taken along line 2—2 of FIG. 3A, of a second embodiment of an electro-expulsive deicing system in accordance with the present invention.

Referring now to FIG. 2B, a second embodiment 40 of an electro-expulsive deicing system in accordance with the present invention includes a top circuit board 46 comprised of conductive lines (illustrated in FIG. 1A) formed on a circuit board substrate 54. An intermediate circuit board 48 is comprised of conductive lines (illustrated in FIG. 1A) formed on a circuit board substrate 58. Circuit boards 46 and 48 make up a top expulsive member 42. A bottom circuit board 52 is comprised of conductive lines (illustrated in FIG. 1A) formed on a circuit board substrate 66. An intermediate circuit board 50 is comprised of conductive lines (illustrated in FIG. 1A) on a circuit board substrate 62. Circuit boards 50 and 52 make up a bottom expulsive member 44. Conductive lines 56, 60, 64, 64 are electrically interconnected on their respective circuit boards 46, 48, 50, 52 with electrical buses 90, 91, 92 and 93. Electrical buses 90–93 are formed on substrates 54, 58, 62, 66 in a manner similar to the formation of the respective conductive lines formed on those substrates. Electrical buses 90–93 are located at the ends of the conductive lines. Electrical buses 90, 91 are connected serially by an electrically conductive path 94 so that current flows in the same direction through circuit boards 46 and 48. Electrical buses 92, 93 are connected serially by an electrically conductive path 95 so that current flows in the same direction through circuit boards 50 and 52. Conductive paths 94 and 95 are electrically interconnected by a conductive path 96 so that current flowing in expulsive member 42 flows in an opposite direction than current flowing in expulsive members 42, 44. Arrows 97 illustrate the direction of flow of the current. Electrically conductive paths 94–96 may be any of a number of means adapted to provide electrical conduction between expulsive members 42 and 44, such as a flexible bus or ribbon cable. The conductive paths 94–96 must however, be flexible enough to facilitate explosive like expulsive separation of the two expulsive members 42, 44 when current flows through them.

A circuit for providing the necessary impulse current to cause adequate expulsive force is disclosed in commonly owned U.S. Pat. No. 4,875,644 to Adams et al., which is hereby incorporated herein by reference. A suitable circuit for providing current is illustrated in FIG. 11 of that patent. In brief, a capacitor bank may be charged to an adequate voltage and then discharged by a control circuit into an applicable deicing zone.

Figure 3A:
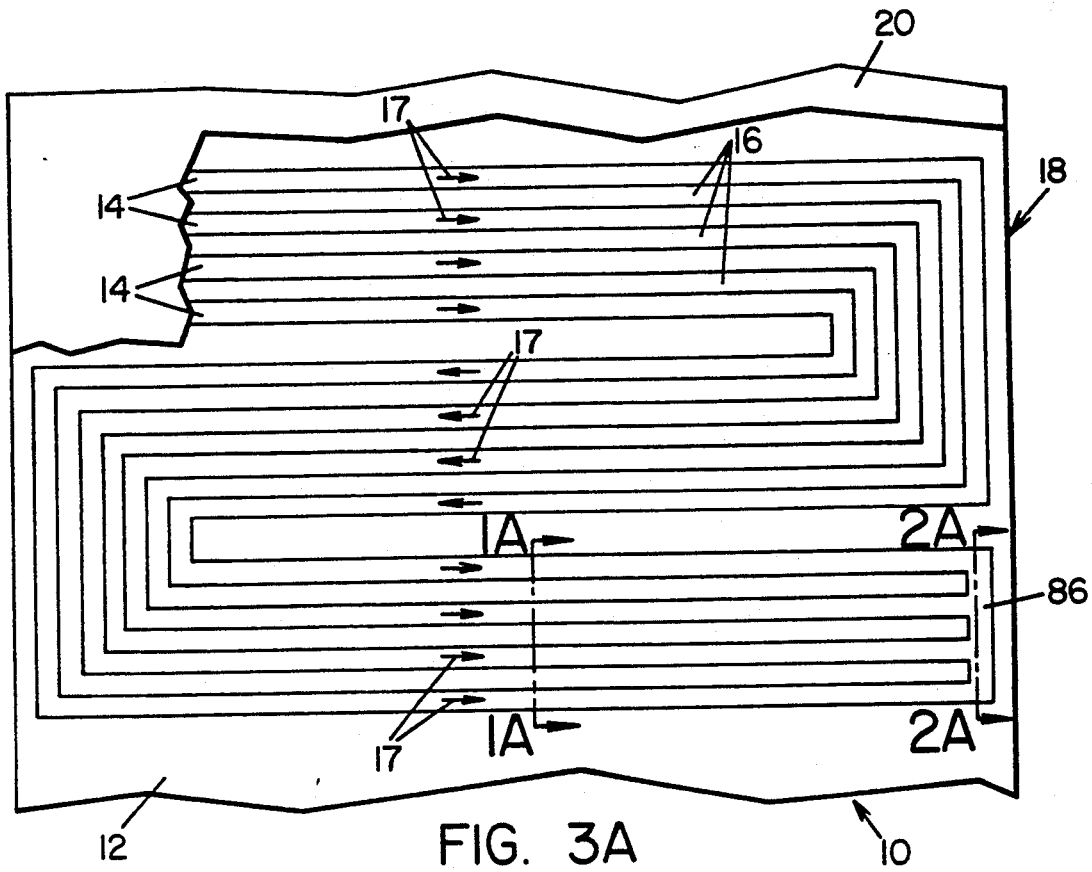
FIG. 3A is a top view of first embodiment of a circuit board for an electro-expulsive deicing system in accordance with the present invention.

Referring now to FIG. 3A, a circuit board 18 for an electro-expulsive deicing system in accordance with the present invention includes a substrate 12 having a pattern of substantially parallel conductive lines 14 deposited thereon in a serpentine or zig-zag type configuration. Conductive lines 14 should be parallel or substantially parallel to minimize counter productive electromagnetic forces between each of the lines. Although four lines are shown for exemplary purposes, it is to be understood that other quantities of lines may be utilized to achieve a similar purpose. The conductive lines 14 are arranged in a serpentine configuration. Other patterns however, not specifically described herein, may also be utilized to achieve a similar electro-expulsive purpose. If conductive lines 14 are made thick enough, the areas between conductive lines 14 may be filled with electrical insulation or isolation members 16 in order to minimize the possibility of arcing between conductive lines 14.

Arrows 17 illustrate the direction of flow of current through conductive lines 14. Conductive lines 14 terminate in an electrically conductive bus 86 at the end of the pattern.

Figure 3B:
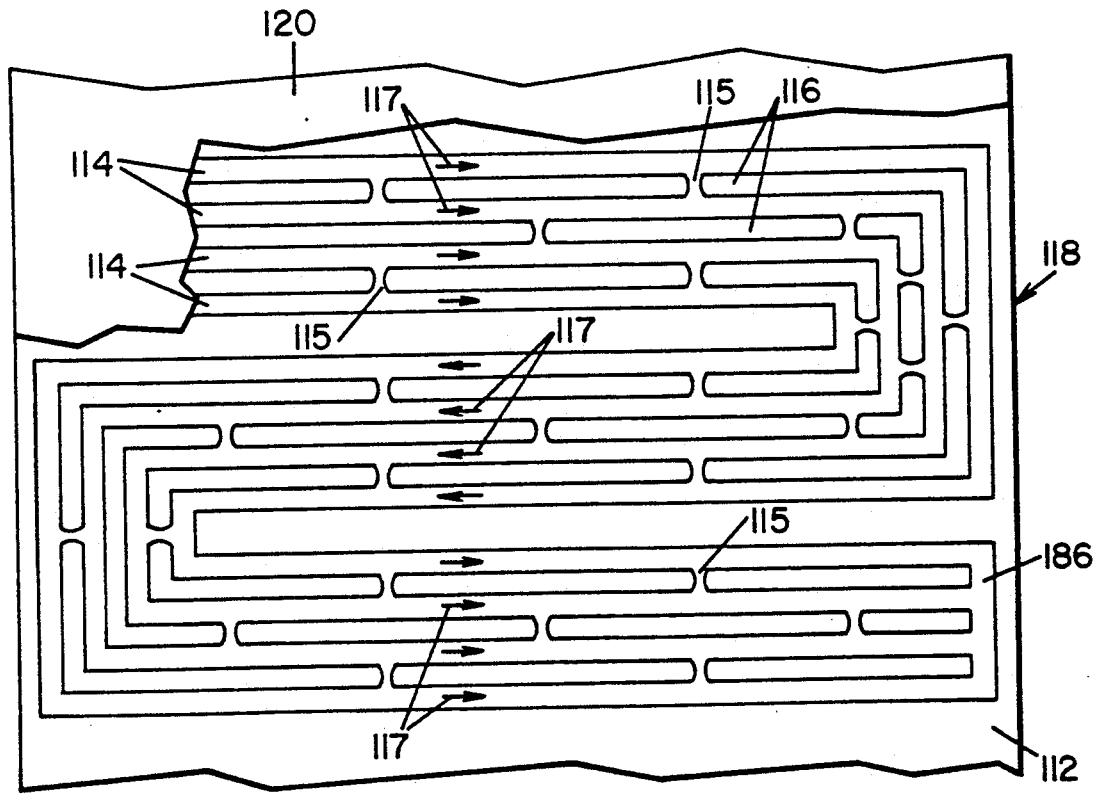
FIG. 3B is a top view of a second embodiment of a circuit board for an electro-expulsive deicing system in accordance with the present invention.

Referring now to FIG. 3B, wherein a circuit board 118 for an electro-expulsive deicing system in accordance with a third embodiment of the present invention is generally similar to the electro-expulsive deicing system embodiments illustrated hereinbefore in the previous figures and is thus indicated by references numerals corresponding to those discussed above, except that a 100 "prefix" is utilized. Circuit board 118 includes a circuit board substrate 112 having a pattern of a plurality of conductive lines 114 formed thereon in a serpentine like configuration. A plurality of conductive bridges 115 are formed between lines 114 at periodic intervals and are utilized to provide enhanced reliability. Conductive bridges 115 may be formed utilizing the same techniques for forming conductive lines 114. The specific pattern for conductive bridges 115 is dependent upon the particular deicing application in which they are being utilized, wherein it is necessary to empirically determine the precise pattern which yields the most favorable results. It is preferable, however, that the location of each conductive bridge be staggered with the conductive bridges disposed on adjacent conductive lines. The conductive bridges 115 should be as small as possible and spaced far enough apart to ensure adequate electrical conduction through conductive lines 114 in the directions indicated by arrows 117 for providing proper electro-expulsive force between adjacent circuit boards or expulsive members.

The effects of a failure (i.e. an open) of any segment of conductive lines 114 will be minimized due to conduction of current around that section via the conductive bridges 115. Conductive bridges 115 also reduce the net resistance of each circuit board (e.g. circuit boards 18, 22 of FIG. 1A).

Although conductive bridges 115 are shown and described only for conductive lines 114 formed on a circuit board substrate, these bridges may also be utilized on prior electro-expulsive deicing systems, such as those disclosed in Haslim et al. which is hereby incorporated herein by reference, and Adams et al.. The particular quantity and location of bridges necessary to provide maximum effectiveness will, of course, be dependent on the particular design utilized.

It is to be noted that circuit board substrates 12, 24, 54, 58, 62, 66 and 112 need not be flat as illustrated hereinbefore, but may be configured in any of a number of contours designed to follow the exterior contour of the applicable airfoil.

The present invention provides maximum expulsive forces available for a given conductive path by virtue of the fact that the circuit board layers may be positioned adjacent one another so that opposing currents may be flowing the entire length of the conductive lines in each place or layer. For example, referring to FIG. 1A, the opposing currents flowing in conductive lines 14 and 26 creative expulsive electromagnetic forces along the entire length of conductive lines 14 and 26 since each of the lines are formed in a single plane which can be positioned directly over one another.

The number of conductors in one leg of the circuit with current traveling in the same direction can vary depending on the force needed, the area to be covered, and the construction it is placed in. For the same reasons, the size of the conductor gap, conductor width and conductor gap between current paths may vary depending on particular design needs. The present invention may also be constructed with more than four planes of conductive paths as illustrated hereinbefore in FIGS. 2B and 3B. The advantages of the present invention is that the conductor pattern can be etched foil, which thereby reduces lay-up time. The number of conductive bridges 115, can also be reduced by designing the pattern so that the ends (not shown) in one plane or layer meet. This pattern may also be connected in such a way as to have all the conductor ends (not shown) of one plane connected to one another.

It is to be noted that the top views of the conductive line patterns illustrated in FIGS. 3A and 3B may be utilized for either of the embodiments illustrated in FIGS. 1A, 1B and FIGS. 2A, 2B. Of course, it is not intended that the inventions illustrated in FIGS. 3A and 3B be limited by the embodiments shown in FIGS. 1A, 1B and FIGS. 2A and 2B. Likewise, the inventions illustrated in FIGS. 1A, 1B and FIGS. 2A and 2B are not intended to be limited by the embodiments shown in FIGS. 3A and 3B.

Although the invention has been shown and described with exemplary embodiments thereof, it should be understood by those skilled in art that the foregoing and various other changes, omissions and additions may be made therein and thereto without departing from the spirit and the scope of the invention.

I claim:
1. A deicing apparatus comprising:
   a first circuit board having a first pattern of a plurality of first electrically conductive members formed on a first substrate and electrically isolated from one another in parallel spaced-apart relationship;
   a second circuit board having a second pattern of a plurality of second electrically conductive members formed on a second substrate and electrically isolated from one another in parallel spaced-apart relationship; and,
   electrical connection means for electrically interconnecting said first pattern to said second pattern so that any electrical current flowing in said first electrically conductive members flows in the same direction in adjacent said first electrically conductive members and also flows in adjacent said second electrically conductive members in a direction opposite to the flow in said first electrically conductive members, thereby producing an electro-expulsive separation force between said first and second electrically conductive members which produces a separation between said first and second electrically conductive members,
   wherein said first circuit board is superposed proximate to said second circuit board so that said first and second electrically conductive members are substantially parallel.

2. A deicing apparatus according to claim 1, wherein said first and second patterns are a serpentine configuration.

3. A deicing apparatus according to claim 1, wherein each of said first electrically conductive members are positioned directly over corresponding ones of said second electrically conductive members.

4. A deicing apparats according to claim 1, wherein at least one of said first and second electrically conductive members are formed from a thin metallic sheet.

5. A deicing apparatus according to claims 1, wherein said electrical connection means is comprised of a flexible conductive ribbon cable.

6. A deicing apparatus according to claim 1, further comprising:
   a third circuit board having a third pattern of a plurality of third electrically conductive numbers disposed on a third substrate and electrically isolated from one another in parallel spaced-apart relationship, said third pattern overlaying and in contact with said first pattern; and, a fourth circuit board having a fourth pattern of a plurality of fourth electrically conductive members disposed on a fourth substrate and electrically isolated from one another in a parallel spaced-apart relationship, said fourth pattern overlaying and in contact with said second pattern, wherein said electrically conductive members of said third and fourth patterns ar electrically connected to said first and second conductive members so that any electrical current flowing in said third electrically conductive members flows in the same direction as in said first said electrically conductive members and also flows in said fourth electrically conductive members in the same direction as in said second electrically conductive members.

7. A deicing apparatus according to claim 1, further comprising:

at least one additional circuit board having an additional pattern of a plurality of conductive members electrically isolated from one another in a parallel spaced-apart relationship, said additional pattern being coextensive with and superposed approximate to one of said first and second patterns, said additional electrically conductive members being electrically interconnected so that any electrical current flowing in said additional electrically conductive members flows in the same direction in adjacent additional electrically conductive members as it flows in the conductive members of the pattern to which said additional pattern is nearest.

8. A deicing apparatus in accordance with claim 1, wherein said first electrically conductive members are deposited on said first substrate and said second electrically conductive members are deposited on second substrate.

9. A deicing apparatus in accordance with claim 1, wherein said first electrically conductive members are etched on said first substrate and said second electrically conductive members are etched on said second substrate.

10. A deicing apparatus in accordance with claim 1, wherein said first electrically conductive members are bonded on said first substrate and said second electrically conductive members are bonded on said second substrate.

11. A deicing apparatus comprising:

a first expulsive means having a first circuit board having a first pattern of a plurality of first electrically conductive members formed on a first substrate and electrically isolated from one another in parallel spaced-apart relationship, a second circuit board having a second pattern of a plurality of second electrically conductive members disposed on a second substrate and electrically isolated from one another in parallel spaced-apart relationship, said second circuit board overlaying said first circuit board so that said second pattern overlays said first pattern, first interconnection means for interconnecting said first and second patterns so that any current flowing in said first and second patterns flows in the same direction;

a second expulsive means having a third circuit board having a third pattern of a plurality of third electrically conductive members formed on a third substrate and electrically isolated from one another in parallel spaced-apart relationship, a fourth circuit board having a fourth pattern of a plurality of fourth electrically conductive members disposed on a fourth substrate and electrically isolated from one another in a parallel spaced-apart relationship, said fourth circuit board overlaying said third circuit board so that said fourth pattern overlays said third pattern, second interconnection means for interconnecting said second and fourth patterns so that any current flowing in said second and fourth patterns flows in the same direction; and, third electrical connection means for electrically interconnecting said first and second expulsive means so that any current flowing in said first expulsive means flows in a direction opposite to said second expulsive means, thereby producing an electro-expulsive separation force between said first and second expulsive means, wherein said first expulsive means is superposed proximate to said second expulsive means so that said first and second electrically conductive members are substantially parallel to said third and fourth electrically conductive members.

12. A deicing apparatus according to claim 11, wherein said first, second, third and fourth patterns are a serpentine configuration.

13. A deicing apparatus according to claim 11, wherein each of said first and second electrically conductive members are positioned directly over corresponding ones of said third and fourth electrically conductive members.

14. A deicing apparatus according to claim 11, wherein at least one of said first and second electrically conductive members are formed from a thin metallic sheet.

15. A deicing apparatus according to claim 11, wherein said electrical connection means is comprised of a flexible conductive ribbon cable.

16. A deicing apparatus comprising:

at least two upper and at least two lower superposed coextensive circuit boards, each said circuit board having electrically conductive members formed on a substrate in a predetermined pattern and being proximate to an adjacent circuit board and electrically isolated from any adjacent circuit board by said substrate, each of said patterns being a plurality of parallel, closely spaced, electrically conductive members, said circuit boards being arranged so that the electrically conductive members of all said circuit boards are substantially parallel and overlay one another, the electrically conductive members being! interconnected so that any electrical current flowing in the corresponding proximate electrically conductive members of said upper circuit boards flows in the same direction and also flows in corresponding proximate electrically conductive members of said lower circuit boards in a direction opposite to the flow in the electrically conductive members of said upper circuit boards, thereby producing an electro-expulsive separation force between said upper and said lower circuit boards, said circuit boards being joined to define a unit.

17. A deicing apparatus in accordance with claim 16, wherein each said electrically conductive members are deposited on each said substrate.

18. A deicing apparatus in accordance with claim 16, wherein each said electrically conductive members are etched on each said substrate.

19. A deicing apparatus in accordance with claim 16, wherein each said electrically conductive members are bonded on each said substrate.

20. A method for constructing a deicing apparatus comprising the steps of:

forming a first pattern of a plurality of first electrically conductive members on a first substrate in parallel spaced-apart relationship, said first electrically conductive members being electrically isolated from one another;

forming a second pattern of a plurality of second electrically conductive members on a second substrate in parallel spaced apart relationship, said second electrically conductive members being electrically isolated from one another;

superposing said first electrically conductive members proximate to said second electrically conductive members so that said first and second electrically conductive members are substantially parallel; and, electrically interconnecting said first pattern to said second pattern so that any electrical current flowing in said first electrically conductive members flows in the same direction in adjacent said first electrically conductive members and also flows in adjacent said second electrically conductive members in a direction opposite to the flow in said first electrically conductive members, thereby producing an electro-expulsive separation force between said first and second electrically conductive members which produces a separation between said first and second electrically conductive members.

21. A method for constructing a deicing apparatus in accordance with claim 20, wherein said forming steps comprise etching said patterns out of a metal clad circuit board.

22. A method for constructing a deicing apparatus in accordance with claim 20, wherein said forming steps comprise depositing said patterns on an insulative substrate.

23. A method for constructing a deicing apparatus in accordance with claim 20, wherein said forming steps comprise etching serpentine patterns out of a metal clad circuit board.

24. A method for constructing a deicing apparatus in accordance with claim 20, wherein said forming steps comprise depositing serpentine patterns on an insulative substrate.

25. A method for constructing a deicing apparatus comprising the steps of:

forming a first pattern of a plurality of first electrically conductive members on a first substrate in parallel spaced-apart relationship being electrically isolated, said first electrically conductive members from one another;

forming a second pattern of a plurality of second electrically conductive members on a second substrate in parallel spaced apart relationship, said second electrically conductive members being electrically isolated from one another;

superposing said first electrically conductive members proximate to said second electrically conductive members so that said first and second electrically conductive members are substantially parallel;

electrically interconnecting said first pattern to said second pattern so that any electrical current flowing in said first electrically conductive members flows in the same direction in adjacent said first electrically conductive members and also flows in adjacent said second electrically conductive members in a direction opposite to the flow in said first electrically conductive members, thereby producing an electro-expulsive separation force between said first and second electrically conductive members which produces a separation between said first and second electrically conductive members;

forming at least one additional pattern of additional electrically conductive members in a parallel spaced-apart relationship on an additional substrate, said additional electrically conductive being electrically isolated members from one another;

superposing said additional pattern coextensive and proximate to one of said first and second patterns; and, electrically interconnecting said additional electrically conductive members with one of said first and second patterns so that any electrical current flowing in said additional electrically conductive members flows in the same direction in adjacent additional electrically conductive members as it flows in the conductive members of the pattern to which said additional pattern is nearest.

26. A method for constructing a deicing apparatus in accordance with claim 25, wherein said forming steps comprise etching said patterns out of a metal clad circuit board.

27. A method for constructing a deicing apparatus in accordance with claim 25, wherein said forming steps comprise depositing said patterns on an insulative substrate.

28. A method for constructing a deicing apparatus in accordance with claim 25, wherein said forming steps comprise etching serpentine patterns out of a metal clad circuit board.

29. A method for constructing a deicing apparatus in accordance with claim 25, wherein said forming steps comprise depositing serpentine patterns on an insulative substrate.

* * * * *